United States Patent [19]

Nozue

[11] Patent Number: 4,791,302

[45] Date of Patent: Dec. 13, 1988

[54] SEMICONDUCTOR WAFER FOR PROVIDING A PLURALITY OF SEMICONDUCTOR CHIPS THROUGH ELECTRON-BEAM LITHOGRAPHY

[75] Inventor: Hiroshi Nozue, Tokyo, Japan

[73] Assignee: NEC Corporation, Tokyo, Japan

[21] Appl. No.: 921,183

[22] Filed: Oct. 21, 1986

[30] Foreign Application Priority Data

Oct. 21, 1985 [JP] Japan ................................ 60-234937

[51] Int. Cl.$^4$ ............................................. A61N 5/00
[52] U.S. Cl. ............................... 250/491.1; 250/492.2; 356/401
[58] Field of Search ...................... 356/401; 250/491.1, 250/492.2

[56] References Cited

U.S. PATENT DOCUMENTS 3,849,659  11/1974  O'Keeffe ...................... 250/491.1 X
4,327,292  4/1982   Wang et al. ..................... 250/491.1
4,564,764  1/1986   Yasuda et al. ................... 250/491.1
4,590,382  5/1986   Tabata ........................... 250/491.1
4,712,016  12/1987  Matsumura ..................... 356/401 X

FOREIGN PATENT DOCUMENTS 0096734  6/1983  Japan ................................ 250/491.1

Primary Examiner—Eugene R. LaRoche
Assistant Examiner—David Mis
Attorney, Agent, or Firm—Sughrue, Mion, Zinn, Macpeak & Seas

[57] ABSTRACT

A semiconductor wafer to be processed with the electron-beam lithography and provided with a registration mark is disclosed. The registration mark is comprised of a plurality of patterns having the same shape and arranged in one direction with a constant interval. The pattern may be protruded or grooved from the part surrounding the pattern.

15 Claims, 4 Drawing Sheets

FIG 4
PRIOR ART
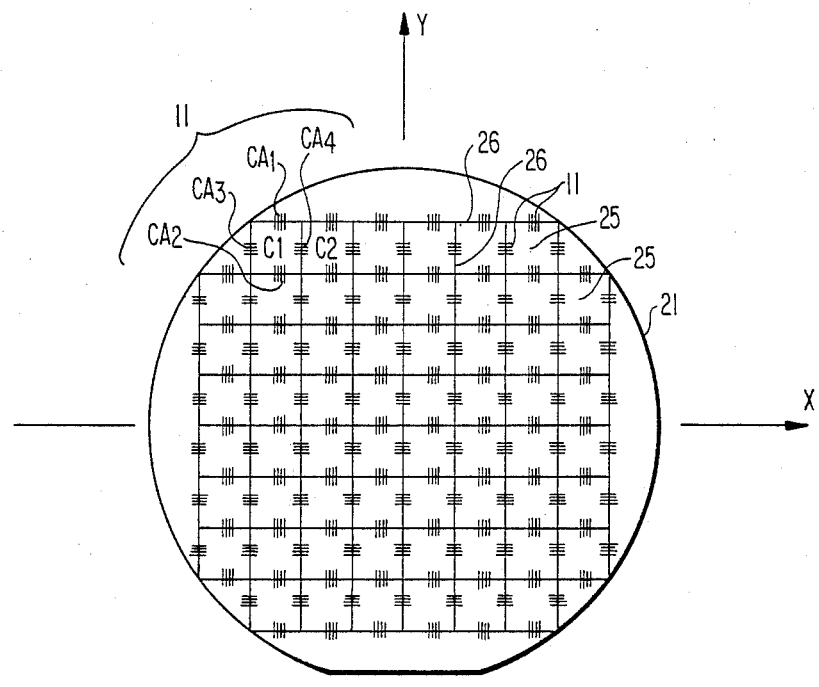
FIG 5

SEMICONDUCTOR WAFER FOR PROVIDING A PLURALITY OF SEMICONDUCTOR CHIPS THROUGH ELECTRON-BEAM LITHOGRAPHY

BACKGROUND OF THE INVENTION

The present invention relates to a semiconductor wafer for providing a plurality of semiconductor chips therein through an electron-beam lithography, and more particularly to a registration mark formed on the semiconductor wafer for the electron-beam lithography.

In the electron-beam lithography, the semiconductor wafer is selectively irradiated with an electron beam. The registration marks are provided on the semiconductor wafer. Before conducting the selective irradiation of the electron beam on a resist film provided on the semiconductor wafer to form a necessary pattern of each semiconductor chip, the electron beam is scanned across the registration mark to estimate the accurate location of the semiconductor wafer or the semiconductor chip. Conventionally, the registration mark has a cross shape of protrusion or depression. In general, the registration mark can be classified into a wafer registration mark having a large size and provided in four peripheral portions of the semiconductor wafer, respectively, and a chip registration mark having a smaller size than that of the wafer registration mark and provided in four corner portions of each semiconductor chip, respectively. In the alignment procedure, the electron beam is scanned in one direction (say, X-direction on an X-Y plane) to cross a predetermined section of the registration mark, and backscattered high energy electrons are detected by a backscattered electron detector located above the semiconductor wafer. Whenever the scanned electron beam passes the side edges of the predetermined section of the registration mark, a large amount of the backscattered electrons are detected by the detector which thereby outputs peak signals. The position of the registration mark, that is, of the wafer or the chip, in the X-direction can be estimated by the peak signals, and the result is sent to a computer installed in the electron-beam lithography apparatus. In the same manner the position in the Y-direction is estimated. In accordance with the estimated results, the computer controls a X-Y stage control system or an electron beam control system to form the designed pattern on the semiconductor chip.

The output waveform of the backscattered electron detector, however, involves inevitably many noises having relatively high level at random positions. Therefore, it is sometimes difficult to detect the peak signals and to determine the position of the side edges of the registration mark. To solve this problem, in the prior art, the electron beam is repeatedly scanned on the same predetermined section of the registration mark, for example, 10 to 30 times and the output waveforms of the detector which includes both the peak signals and the noises are added. Since peak signals are produced at the fixed positions in every waveforms and the noises are produced at random positions, the added waveform has a high S/N (peak signal to noise) ratio and a precise alignment can be realized. However, when the electron beam is scanned many times, a large amount of electrons are accumulated in the resist film along the passage of electron beam scanning. Therefore, the resist film is subjected to a baked phenomenon, that is, the resist film is tightly fixed to a material such as silicon, silicon oxide, etc. forming the registration mark so that it is hardly removed by a general resist removing solution such as OMR 502 (product of Tokyo Ohka Co., Ltd.), 1112A (product of Shipley Co., Ltd.), etc. If an electron beam having a rectangular plan shape of 12.5 $\mu m \times 1$ $\mu m$ and electrical density of 0.4 A (ampere)/$cm^2$, for example, is scanned 30 times, charges of about 3000 $\mu c$ (micro coulomb)/$cm^2$ is dosed in the resist film. It is to be noted that a resist film used in the electron-beam lithography is subjected to the baked phenomenon mentioned above when the dosage becomes 300 to 1000 $\mu c/cm^2$ or more. To remove the baked resist film, hot sulfuric acid ($H_2SO_4$) or hot nitric acid $HNO_3$) must be used. However, in this case, an aluminum film formed in a previous process step would be corroded. Altenatively, oxygen plasma can be used to make dry etching of the baked resist film, but suffered with unfavorable influence to be induced in the semiconductor substrate.

Further, in the prior art, the registration mark has a cross shape in the plan view consisting of one rectangular portion extending in Y-direction and one rectangular portion extending in X-direction and crossing the former portion, and when the alignment in X-direction is conducted, the only one rectangular portion extending in Y-direction is used as the registration mark. Therefore, the registration mark is mistakable with a region of an element pattern having a similar shape with the elongated portion of the registration mark and positioned near the mark. To avoid the erroneous estimation, the difference in height between the surface of the registration mark and the surface of the part near the mark must be 1.0 $\mu m$ or more. Therefore, in general, the registration mark must be formed at a first process step among a plurality of process steps for forming the semiconductor device, and the mark must be used till the final process step in the wafer state. However, during manufacturing the device, requirements sometimes occur that a pattern formed in one process step must be precisely aligned with another pattern formed through just previous process step. In this case, it is favorable that a new registration mark is formed in the previous process step with the another pattern. However, if the previous process step is of patterning a film of polycrystalline silicon or insulating material having the thickness of 0.2 to 0.5 $\mu m$, the registration mark having the thickness of 1.0 $\mu m$ or more cannot be formed in the previous process step.

SUMMARY OF THE INVENTION

Accordingly, one object of the present invention is to provide a semiconductor wafer having an effective registration mark for an electron-beam lithography which can precisely estimate the position of the chip to be patterned.

Another object of the present invention is to provide a registration mark which requires a small amount of electrons to be doped into the resist film on the registration mark by the scanning electron beam so that the baked phenomenon of the resist film is prevented to occur.

Still other object of the present invention is to provide a semiconductor wafer having an effective registration mark for an electron-beam lithography which can be formed during a desirable process step even if the thickness of the registration mark is small, clearly distinguished from an element pattern positioned in the vicinity of the registration mark.

According to a feature of the present invention, there is provided a registration mark for the electronbeam lithography. The registration mark comprises a plurality of protruded or grooved patterns. The pattern has substantially the same shape in the plan view, and are arranged in one direction with a substantially constant interval, each other. Generally, the pattern has a rectangular shape in the plan view, and a longer side of one pattern faces to a longer side of adjacent pattern. Favorably, the number of the patterns ranges from 40 to 100, and the constant interval may be selected from a value ranging from 1 μm to 5 μm. When the pattern has the rectangular shape, the width and the length thereof may be selected from values ranging from 1 μm to 5 μm and 6 μm to 90 μm, respectively. The height or depth of the pattern may ranges 0.2 μm to 0.5 μm. Favorably, the value of the interval and that of the width of the pattern are equal. The rectangular pattern may be elongated at right angle with the boundary line between a scribe region and a chip area, or else inclined to the boundary line. Generally, the registration mark is formed in the scribe region between the chip areas.

BRIEF DESCRIPTION OF THE DRAWING

FIG. 3 and FIG. 4 are diagrams showing signal waves in the prior art, respectively;

FIG. 5 is a plan view showing a semiconductor wafer of an embodiment in the present invention;

DESCRIPTION OF THE PRIOR ART

Figure 1:
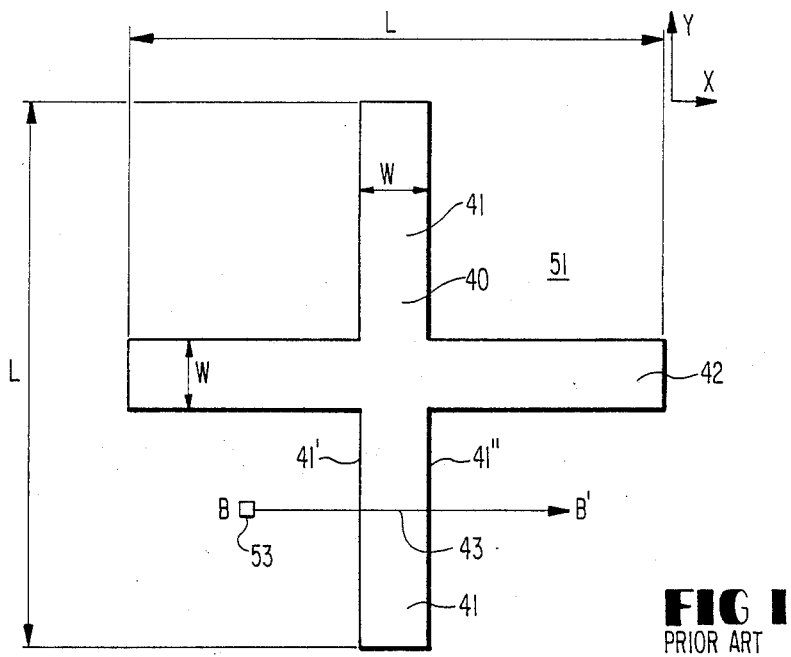
FIG. 1 is a plan view showing a registration mark in a prior art.
Figure 2:
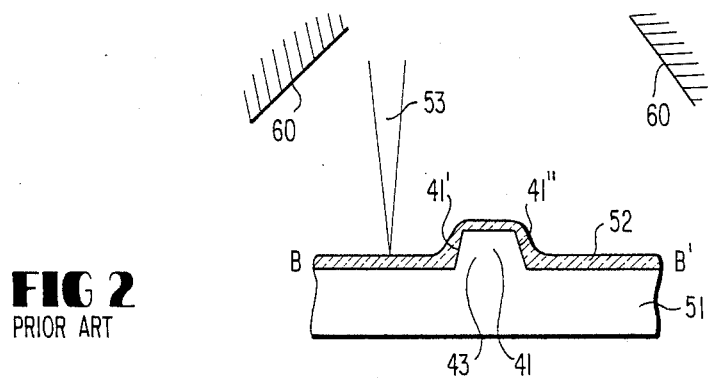
FIG. 2 is a cross-sectional view taken along electron-beam scanning line B→B' in FIG. 1.
Figure 3:
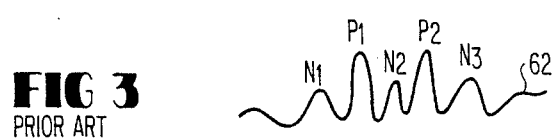

Referring to FIGS. 1 and 2, a registration mark 40 of a cross shape in the plan view is provided in the silicon substrate 51. The registration mark 40 consists of a first portion 41 elongated in Y-direction and a second portion 42 elongated in X-direction and crossing the first portion 41 at their center part, and protruded 1 μm or more from the part of the substrate near the mark. Each of the first and second portions has the width W of 5 to 10 μm in both cases of wafer mark and chip mark, and the length L of 1 to 2 mm in the case of wafer mark and 50 to 100 μm in the case of chip mark. The registration mark 40 is formed in the first process step among a plurality of process steps for manufacturing a semiconductor device and used in the alignment procedure of following all process steps. When the alignment in X-direction is conducted, an electron beam 53 is scanned from B to B' such that it crosses a section 43 of the first protruded portion 41. Backscattered electrons are produced and a large number of backscattered electrons are collected to a backscattered electron detector 60, when the scanning electron beam 53 is positioned at edges 41', 41" of the section 43 in the protruded portion 41. Therefore, as shown in FIG. 3, peak signals $P_1$, $P_2$ are detected at positions corresponding edges 41', 41". However, large level noises $N_1$, $N_2$, $N_3$ are also involved in the signal wave 62. Accordingly, the scanning of the electron beam 53 are repeated in many times at the same path B→B', and by adding the signal waves, a signal wave 61 shown in FIG. 4 having a high S/N ratio can be obtained. However, a resist film 52 formed on the substrate including the registration mark is baked at the passage B→B' of the electron beam by the many scannings.

DESCRIPTION OF THE EMBODIMENTS

Figure 6A:
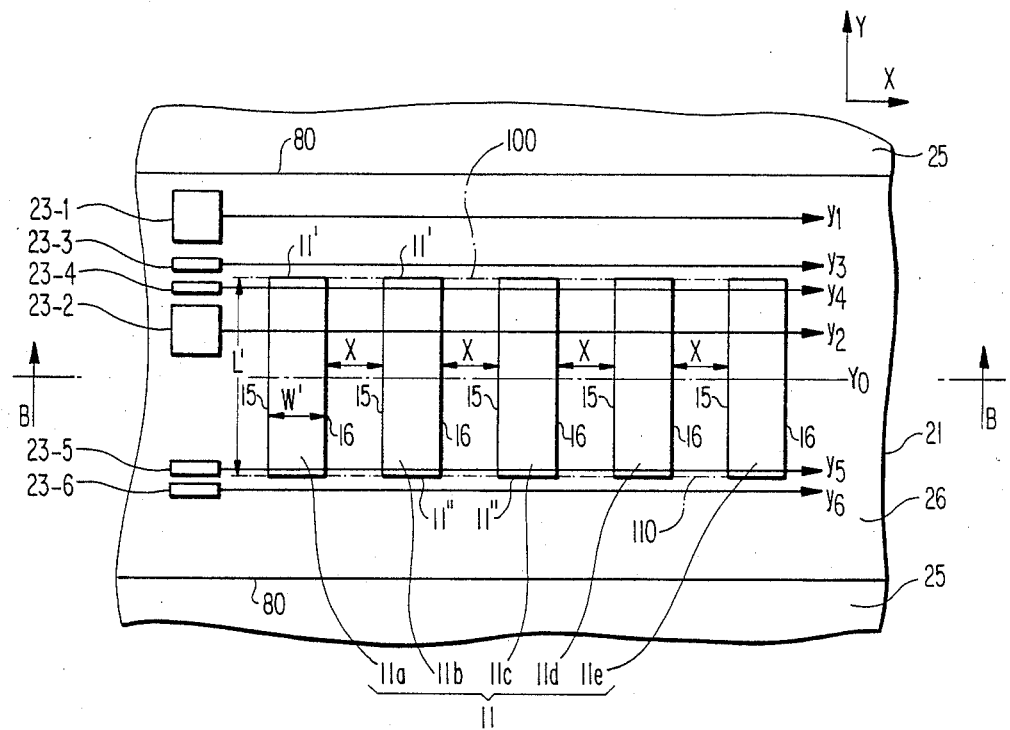
FIG. 6A is a plan view showing a registration mark of an embodiment.
Figure 6B:
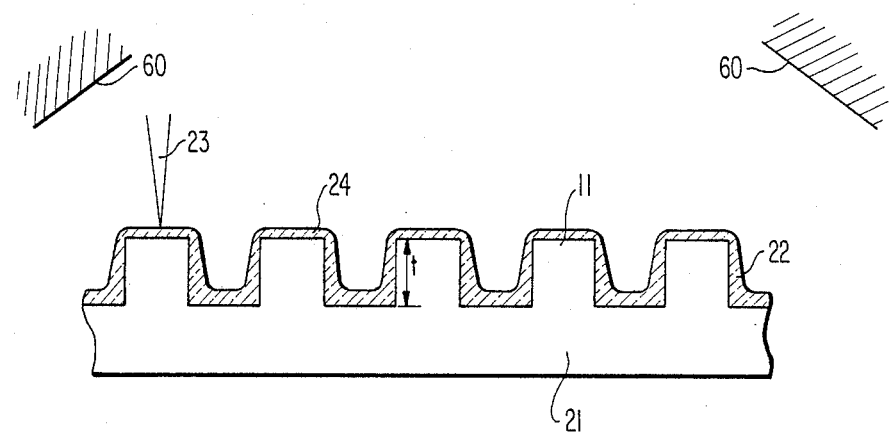
FIG. 6B is a cross-sectional view taken along line B—B' in FIG. 6A as viewed in the direction of arrows.

Referring to FIG. 5, in a silicon wafer 21 a plurality of chip areas 25 ($C_1$, $C_2$, . . . ) are provided in a matrix form, and each of the chip areas are surrounded by scribe regions 26 of about 100 μm width. The semiconductor wafer 21 is installed on an X-Y stage (not shown). Restration marks 11 ($CA_1$, $CA_2$, $CA_3$, $CA_4$, . . . ) are provided in the scribe regions 26. Referring to FIGS. 6A, 6B, the registration mark 11 includes a plurality of rectangular patters 11a, 11b, 11c, 11d, 11e. The rectangular pattern has the same shape in the plan view and in the cross sectional view, each other, and arranged with a constant interval. Further, one edge 11' of the respective patterns are arranged in a straight phantom line 100 extending in X-direction, and also the other edge 11" of the respective patterns are arranged in a straight phantom line 110 extending in X-direction. Each of the rectangular patterns 11a to 11e extends in Y-direction at right angle with the boundary line 80 between the chip area 25 and the scribe region 26, and the boundary line 80 extends in X-direction. Namely, the phantom lines 100, 110 are in parallel with the boundary line 80. Each of the rectangular patterns has the width W' of 2 μm and the length L' of 50 μm, and each interval has the distance X of 2 μm. The height t of the pattern is 0.3 μm. Further, seventy five rectangular patterns are provided though only five rectangular patterns are exemplified in FIGS. 6A and 6B.

The registration mark is formed before a process step in which an electron beam lithography is conducted by using the registration mark. For example, a gate electrode pattern of a MOS transistor must be precisely aligned with a field oxide layer, and therefore a registration mark employing an electron beam lithography for forming the gate electrode pattern is favorably formed with the field oxide layer. A registration mark employing an electron beam lithography for forming a contact pattern is favorably formed with the gate electrode pattern. Further, a registration mark employing an electron beam lithography for forming a wiring layer pattern such as an aluminum pattern is favorably formed with the contact patterning in an insulating film. In this case, the height t of the registration mark becomes, for example, 0.2 to 0.5 μm. However, a plurality of rectangular patterns arranged in one direction are not formed, in general, in the chip area or in an element pattern near the registration mark, and therefore even if the height of the registration mark is 0.2 μm to 0.5 μm, the registration mark can be clearly distinguished from the element pattern. Of course, a registration mark formed in the first process step, that is, of forming the field oxide layer may be used, through all process steps till the final process step in the wafer state.

The registration marks 11 of the chip area $C_1$ are formed in four scribe regions 26 such as $CA_1$ to $CA_4$ in FIG. 5. However, when the alignment speed is more important than the precise alignment, two of registration marks 11 may be provided such that one is in X- direction and the other in Y-direction. As mentioned above, the registration mark of the present invention may be formed in various process steps. Therefore, the mark may be made of silicon oxide, polycrystalline silicon, etc. as well as silicon.

Figure 7A:
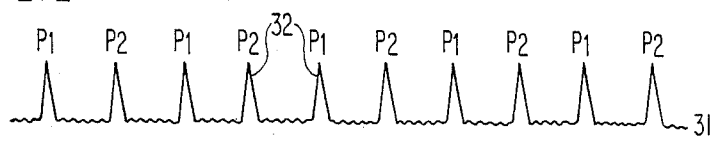
FIG. 7A and FIG. 7B are diagrams showing signal waves including peak signal (FIG. 7A) and noises (FIG. 7B)
Figure 7B:

The method of alignment by using the registration mark 11 will be explained. The resist film 22 for electron-beam lithography has been coated on the silicon substrate 21 including the registration mark 11 provided in the scribe region 26. The alignment is conducted by scanning the electron beam 23 in X-direction. When the electron beam 23 is scanned on the registration mark 11, a signal wave 31 including peak signals 32 ($P_1$, $P_2$) which are periodically produced, as shown in FIG. 7A, by backscattered high energy electrons collected to the detector 60 provided above the semiconductor substrate is obtained. Namely, the peak signals $P_1$ in FIG. 7A are produced when the electron beam is passed just on the left side edges 15 (see FIG. 6A) of the rectangular patterns in the registration mark, and the peak signals $P_2$ are produced when the electron beam is passed just on the right side edges 16 thereof (see FIG. 6A). On the other hand, when the electron beam 23 is scanned on the passage where any registration mark does not exist, the signal wave 33 which involves only nonperiodical noises is obtained as shown in FIG. 7B. More particularly, the signal wave 31 in FIG. 7A has some noises as in FIG. 3. However, according to the present invention, many peak signals 32 are produced, and therefore even if some noises would be involved in the signal wave 31, the estimation can be securely conducted. Namely, if periodical signal peaks are detected in only one portion of the signal wave obtained by one scanning, the scanning passage can be estimated to be on the registration mark even if many noise having high level are produced in the other portion of the signal wave.

Returning to FIG. 5, in the embodiment of the present invention, only chip marks 11 employ without any wafer mark. When the electron beam lithography conducts to the chip area $C_1$, at first, the registration mark $CA_1$ is positioned under an electron beam system (not shown) by moving an X-Y stage (not shown) on which the silicon wafer 21 is installed. The alignment in Y-direction of the chip area $C_1$ is conducted by using the registration marks $CA_1$ and $CA_2$, and in X-direction, the registration marks $CA_3$ and $CA_4$ are used.

Referring to FIG. 6A again, the alignment manner in Y-direction by using the registration mark 11 ($CA_1$ in FIG. 5) will be explained.

At first, the electron beam 23-1 having a large square area, that is, irradiating area of 12.5 $\mu$m $\times$ 12.5 $\mu$m is set by adjusting the electron beam system, and swept in X-direction on a passage $Y_1$ where any registration mark 11 is not formed. Therefore, the signal wave 33 in FIG. 7B obtained. Next, the electron beam, is transferred at a distance of 5 $\mu$m by the electron beam system, and the electron beam 23-2 having the same area as the electron beam 23-1 is swept in X-direction on a passage $Y_2$ where the registration mark 11 is formed. In this case, the signal wave 31 having peak signals 32 is obtained as shown in FIG. 7A. Next, return the electron beam at a distance of 2.5 $\mu$m in Y-direction and change the irradiating area to a rectangular shape of 12.5 $\mu$m (in X-direction) $\times$ 1 $\mu$m (in Y-direction), the changed electron beam 23-3 is swept in X-direction on a passage $Y_3$ where any registration mark is not formed, and therefore the signal wave 33 which involves only noises is obtained. Then, the electron beam of the rectangular area is shift in Y-direction downward in the plan view of FIG. 6A at a minor distance, and scanned in X-direction. By conducting the minor shifting and scanning, the estimation can be achieved where the one edges 11' of the respective patterns of the registration mark 11 are positioned. For example, when the electron beam 23-4 is scanned in the X-direction on a passage $Y_4$, the signal wave 31 having peak signals 32 is obtained.

After the estimation of the position of one edge 11', that is, the position of the phantom line 100 in Y-direction, the rectangular electron beam is downwarly shift at a large distance, and positioned near the other edge 11" of the patterns 11a to 11e, that is, near the phantom line 110 in Y-direction. In this case, the length L' of the pattern is known beforehand, and the electron beam can be set near the edge 11". Then, the electron beam 23-5 is scanned in X-direction on the passage $Y_5$, and the signal wave 31 shown in FIG. 7A is obtained. After shifting minor distance in Y-direction, the electron beam 23-6 is scanned in X-direction on the passage $Y_6$, and the signal 33 shown in FIG. 7B is obtained. Then, the estimation of the position of the other edge 11", that is, the position of the phantom line 110 is estimated, and a calculation is treated in a computer the center position $Y_0$ of the registration mark 11 in Y-direction by using the estimated positions 11' and 11". After the alignment in Y-direction by using the registration mark $CA_1$, and alignment in Y-direction is conducted again by using the registration mark $CA_2$ by the same manner as the registration mark $CA_1$. Also, an alignment in X-direction is conducted by the registration marks $CA_3$ and $CA_4$. Informations obtained by the alignment procedures on the registration marks $CA_1$ to $CA_4$ are sent to the computer, and the shape, angle and position of the semiconductor chip $C_1$ are calculated in the computer. Thereafter, a desire pattern can be formed by an electron beam selective irradiation on the chip area $C_1$ by referring the calculation result in the computer.

According to the present invention, the alignment is conducted by only estimating whether the signal wave involves the periodical peak signal series in at least one portion, or not involves any periodical peak signal series in whole portions. Therefore, even if the S/N (peak signal to noise) ratio would be somewhat low level, many scanning on the same passage is not necessary, and the baked resist phenomenon mentioned above does not occur. In the embodiment, when the density of the electron beam is 0.4 A/cm$^2$, the amount of charges in the resist film becomes only 40 to 100 $\mu$c/cm$^2$.

Figure 8:
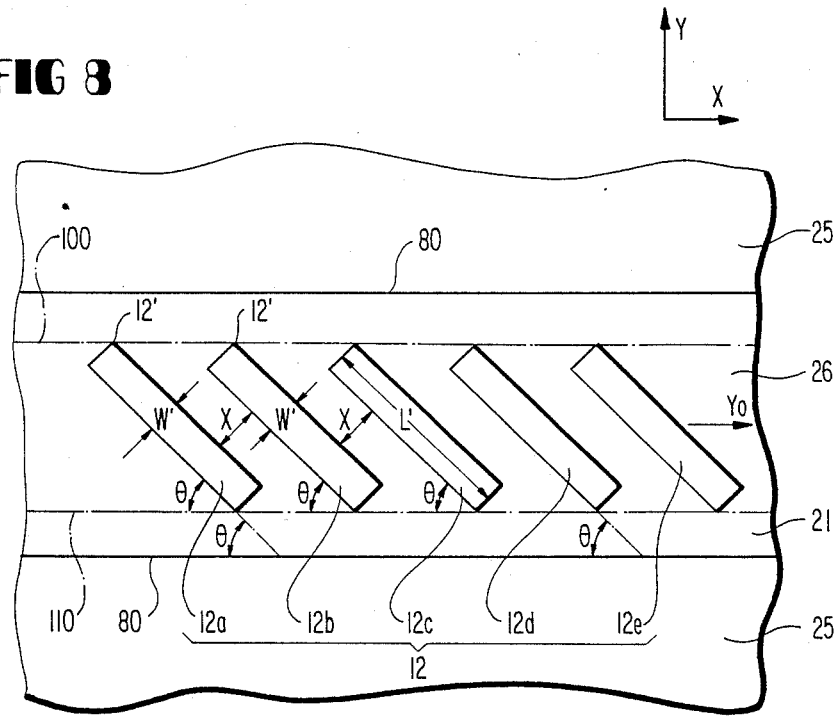
FIG. 8 is a plan view showing a registration mark of another embodiment.

Referring to FIG. 8, the registration mark 12 consisting of a plurality of protruded or grooved patterns 12a to 12e having elongated shape. The patterns has the same shape and arranged with the constant interval as those of FIGS. 6A, 6B. However, each of patterns is inclined in the plan view with the angle $\theta$, for example, 45° against the boundary line 80. In this case, respective one edges 12' are positioned on a straight phantom line 100 extending in X-direction, and the other edges 12" are positioned on a straight phantom line 110 extending in X-direction. The center position $Y_0$ of the registration mark 12 in Y-direction can be estimated by the same manner as shown in FIG. 6A. In FIG. 8, the same components and dimensions as those in FIG. 6A are indicated as the same reference numerals and symbols.

What is claimed is:

1. A semiconductor wafer comprising of a plurality of chip areas arrayed in a matrix form in which semiconductor elements are to be formed, a plurality of scribe regions surrounding each of said chip areas, and a registration mark for employment in electron-beam lithography provided in at least one of said scribe regions, said registration mark including a plurality of regularly spaced rectangular patterns extending in a parallel to each other, said rectangular patterns being arrayed such that the edges of said rectangular patterns are positioned in a straight line which runs in parallel with a boundary line of said scribe region, and each of said rectangular patterns being protruded or depressed from the part of said scribe region surrounding said rectangular pattern.

2. A semiconductor wafer of claim 1, in which each of said rectangular patterns is elongated in a direction perpendicular to a boundary line between said scribe region and said chip area.

3. A semiconductor wafer of claim 1, in which the number of said patterns ranges from 40 to 100.

4. A semiconductor wafer of claim 1, in which the distance of said interval ranges from 1 $\mu$m to 5 $\mu$m.

5. A semiconductor wafer of claim 1, in which said rectangular pattern is one of protruded and depressed by a value ranging from 0.2 $\mu$m to 0.5 $\mu$m.

6. A semiconductor wafer of claim 1, in which said rectangular pattern has a width ranging from 1 $\mu$m to 5 $\mu$m and a length ranging from 6 $\mu$m to 90 $\mu$m.

7. A semiconductor wafer of claim 6, in which said interval has the same dimension as that of said width.

8. A semiconductor wafer of claim 1, in which each of said rectangular patterns is elongated in a direction inclined from a direction perpendicular to a boundary line between said scribe region and said chip area.

9. A semiconductor substrate having a chip area in which a semiconductor element is to be formed, four straight scribe regions abutted against and surrounding said chip area, and four registration marks for employment in electron-beam lithography provided in said four straight scribe regions, respectively, each of said registration marks including a plurality of regularly spaced rectangular patterns extending in a parallel to each other, said rectangular patterns being arrayed such that the edges of said rectangular patterns are positioned in a straight line which runs in parallel with a boundary line of said scribe region and each of said rectangular patterns being protruded or depressed from the part of said scribe region surrounding said rectangular pattern.

10. Method of manufacturing a semiconductor device in a chip area of a semiconductor substrate by use of electron-beam lithography comprising the steps of forming a registration mark in a vicinity of said chip area, said registration mark including a plurality of regularly spaced rectangular patterns of one of protrusion and groove, said rectangular patterns being arrayed in a line running in a first direction, aligning said chip area in a second direction perpendicular to said first direction, and conducting selective irradiation on said chip area, said aligning step including scanning an electron beam in said first direction in the vicinity of said rectangular patterns, detecting whether said registration mark is present by use of back-scattered electrons, repeating the scanning of said electron beam in said first direction at different locations, and determining the edges of said rectangular patterns in said second direction.

11. A method of claim 10, in which the number of said rectangular patterns ranges from 40 to 100.

12. A method of claim 10 in which said rectangular patterns are spaced by a distance from 1 $\mu$m to 5 $\mu$m.

13. A method of claim 10 in which the height or depth of said protrusion or groove, respectively, ranges from 0.2 $\mu$m to 0.5 $\mu$m.

14. A method of claim 10, in which said rectangular pattern has a width in said first direction ranging from 1 $\mu$m to 5$\mu$m and a length in said second direction ranging from 6 $\mu$m to 90 $\mu$m.

15. A method of claim 10, in which each rectangular pattern has a constant angle between 0° and 90° with respect to said line running in said first direction.

* * * * *

UNITED STATES PATENT AND TRADEMARK OFFICE
CERTIFICATE OF CORRECTION

PATENT NO. : 4,791,302
DATED : December 13, 1988
INVENTOR(S) : HIROSHI NOZUE, Tokyo JAPAN It is certified that error appears in the above-identified patent and that said Letters Patent is hereby corrected as shown below:

Column 2, line 16, delete "Alternatively" and insert --Alternatively--.

Column 4, line 17, delete "Restration" and insert --Registration--.

Signed and Sealed this

Twenty-fifth Day of July, 1989

Attest:

DONALD J. QUIGG

*Attesting Officer*        *Commissioner of Patents and Trademarks*